United States Patent [19]
Arnoux

[11] 4,138,717
[45] Feb. 6, 1979

[54] CONSTANT-GAIN REGULATED-PHASE STANDARD-PHASE CONVERTER

[75] Inventor: Daniel Arnoux, Saint Germain en Laye, France

[73] Assignee: Societe Chauvin Arnoux, Paris, France

[21] Appl. No.: 783,803

[22] Filed: Apr. 1, 1977

[30] Foreign Application Priority Data

Apr. 6, 1976 [FR] France .................... 76 09882

[51] Int. Cl.² .......................................... H02M 5/00
[52] U.S. Cl. .................................. 363/156; 328/155; 307/262
[58] Field of Search .................. 307/262; 283/56, 155; 363/148, 149, 156

[56] References Cited

U.S. PATENT DOCUMENTS

| 3,267,358 | 8/1966 | Anderson | 363/149 X |
|---|---|---|---|
| 3,436,647 | 4/1969 | Gobeli et al. | 307/262 X |
| 3,482,116 | 12/1969 | James | 307/262 X |
| 3,597,639 | 8/1971 | Harwood | 328/155 X |
| 3,753,126 | 8/1973 | Hines et al. | 307/262 X |

Primary Examiner—William M. Shoop

[57] ABSTRACT

This phase converter utilizing a reference alternating voltage and producing a phase displaced voltage of same frequency having a common point with the reference voltage comprises a first summation and rectifying unit receiving at a first input the reference voltage and at a second input the phase displaced voltage a second summation and rectifying device receiving a first input the reference voltage and at a second input the phase-displaced voltage a second inverter being switched in at one of said inputs of said second summation and rectifying device both summation and rectifying devices having each an output connected to one input of a summation and filtration device receiving at another input a reference voltage a third inverter being switched in at the output of one of said summation and rectifying devices and said summation and filtration device having an output connected to a control terminal of a field effect transistor.

3 Claims, 5 Drawing Figures

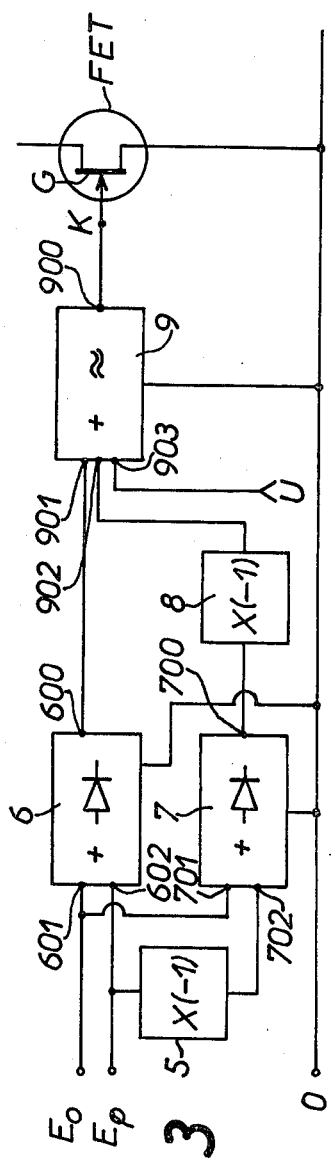
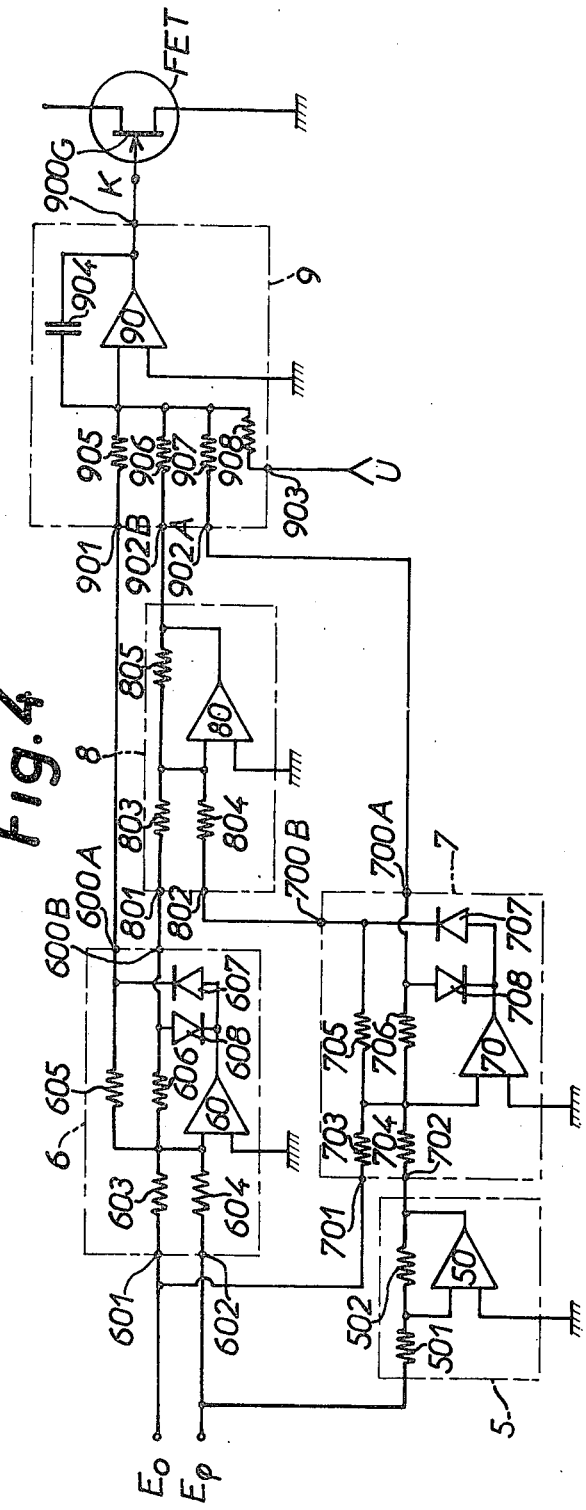
Fig.3
Fig.4

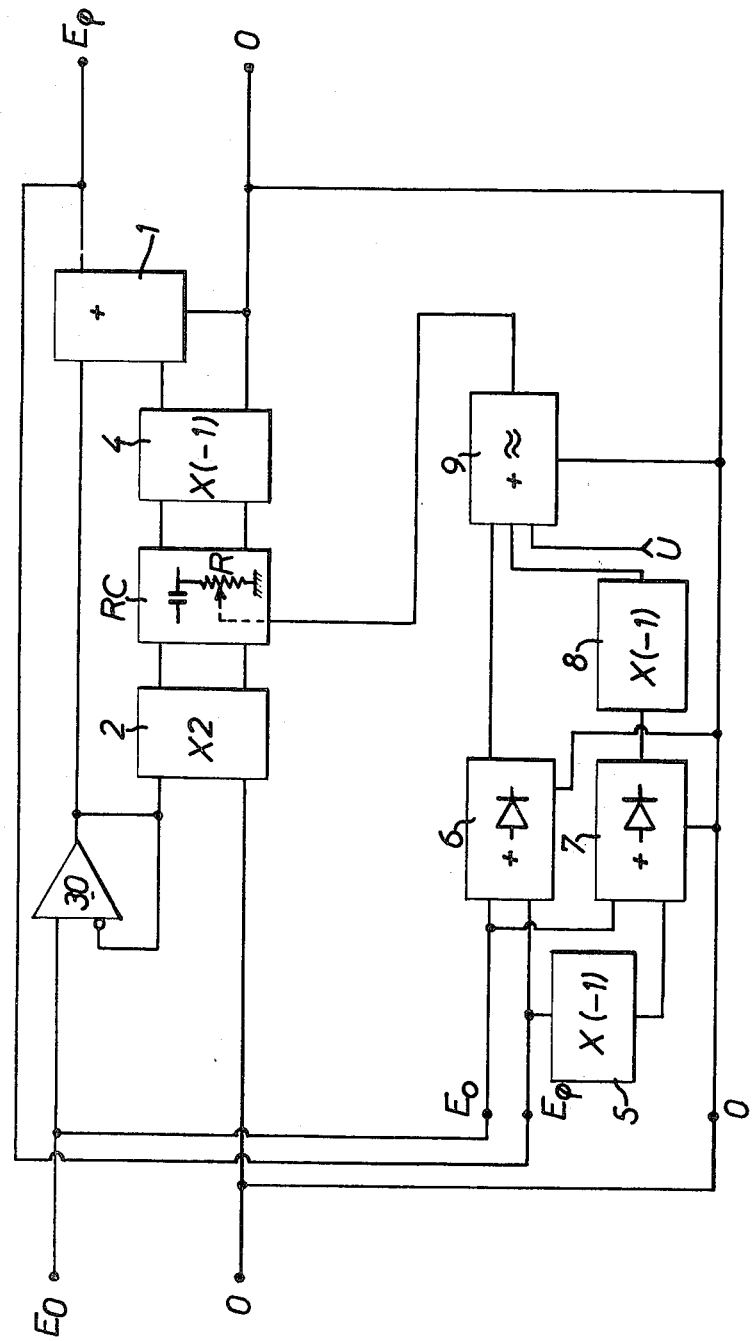

CONSTANT-GAIN REGULATED-PHASE STANDARD-PHASE CONVERTER

BACKGROUND OF THE INVENTION

This invention relates to a method and a phase converter utilizing a reference alternating voltage Eo and producing a regulated phase-displaced voltage E$\phi$ of same frequency and same modulus, and having a common point with said reference voltage, the ratio of the phase-displaced voltage to the reference voltage being represented by a ratio of two complex conjugate numbers having each in relation to a reference axis an argument equal to one-half of a desired phase displacement angle, whereby the phase-displaced voltage can be considered as resulting from a sum of two voltages of which the first voltage $V_1$ is equal to the reference voltage Eo but has its sign inverted and the second voltage $V_2$ is equal to twice a third voltage $V_3$ delivered from a common point to a capacitor and a resistor of an impedance circuit comprising at least said capacitor and said resistor connected in series.

This type of phase converters, sometimes referred to as "pure delay phase converters", is well known and notably described in a book entitled: "The operational amplifier and its applications" by J. C. Marchais, 1971, published by Masson & Cie., Page 95. These known phase converters utilized notably in the French Patent Application No. 2,017,210 filed on Sept. 1, 1969 by N. V. Philips Gloeilampenfabrieken comprise an amplifier having two inputs so that none of them is grounded directly. Due to the interaction between the two inputs of this amplifier the degree of precision of the gain and of the phase displacement angle cannot exceed 0.1% under the most exceptional conditions.

SUMMARY OF THE INVENTION

It is the primary object of the present invention to provide a pure-delay phase converter characterized by a definitely improved stability so that it can be operated as a standard phase converter of the constant gain and regulated phase type.

Moreover, the precision of the phase displacement angle obtained with the phase converter of this invention is not subordinate to the dielectric phase angle or loss angle of the capacitor, provided that this loss angle be of the constant type.

The method according to the present invention is characterized essentially in that least one variable impedance element (FET) is incorporated in said impedance circuit and wherein element (FET) has an impedance controlled by means of a signal responsive at least to a voltage being equal to $$| Eo + E\phi | - | Eo - E\phi |.$$

Preferably, the phase converter of this invention is characterized in that the variable impedance element (FET) is a field effect transistor, that a first summation and rectifying unit receives at a first input the reference voltage and at a second input the phase displaced voltage, that a second summation and rectifying device receives at a first input the reference voltage and at a second input the phase-displaced voltage, a second inverter being switched in at one of said inputs of said second summation and rectifying device, that both summation and rectifying devices have each an output connected to one input of a summation and filtration device receiving at another input a reference voltage, a third inverter being switched in at the output of one of said summation and rectifying devices and that said summation and filtration device has an output connected to a control terminal of said field effect transistor.

BRIEF DESCRIPTION OF THE DRAWING

A specific form of embodiment of this invention will now be described by way of example with reference to the accompanying drawing, in which:

FIG. 3 is a block diagram of a regulating device used in the phase converter of FIG. 1 to obtain the standard phase converter of this invention;

FIG. 4 is a wiring diagram illustrating a typical embodiment of a regulating device of FIG. 3; and FIG. 5 is the wiring diagram illustrating the phase converter according to FIG. 1 connected to the regulating device of FIG. 3.

DESCRIPTION OF THE PREFERRED EMBODIMENT

If Eo is the reference alternating voltage, having a frequency $\omega/2\pi$, injected into the input of a pure-delay phase converter, notably a phase converter concerned by this invention, if E$\phi$ is the voltage available at the output of this phase converter, displaced by an angle $\phi$ in relation to the voltage Eo, having the same frequency $\omega/2\pi$ as the voltage Eo and having with this voltage Eo a common point O, if R and C are the values of a resistor also denoted R and of a capacitor denoted C, respectively, R and C constituting the series-connected components of an impedance circuit RC, and finally if j designates the pure imaginary number, the ratio E$\phi$/Eo may be considered as being the ratio of two complex numbers conjugated in relation to the axis of the real numbers representing the axis of origin of voltages having a zero phase displacement angle, so that:

$$\frac{E\Phi}{Eo} = \frac{R + j/C\omega}{R - j/C\omega} = -1 + \frac{2R}{R - j/C\omega};$$

$$\frac{E\Phi}{Eo} = 1; \text{Arg}(E\Phi) = \Phi/2; \text{Arg}(Eo) = \Phi/2$$

$$\text{et } tg\, \Phi/2 = \frac{1}{RC\omega}$$

Therefore, E is equal to $$-Eo + 2\frac{R}{R - j/C\omega} \cdot Eo$$

and may be considered as being the sum of a first voltage $V_1 = -Eo$ and a second voltage $$V_2 = 2\left(\frac{R}{R - j/C\omega}\right) Eo = 2 V_3$$

wherein $$V_3 = \frac{R}{R - j/C\omega} \cdot Eo.$$

Figure 1:
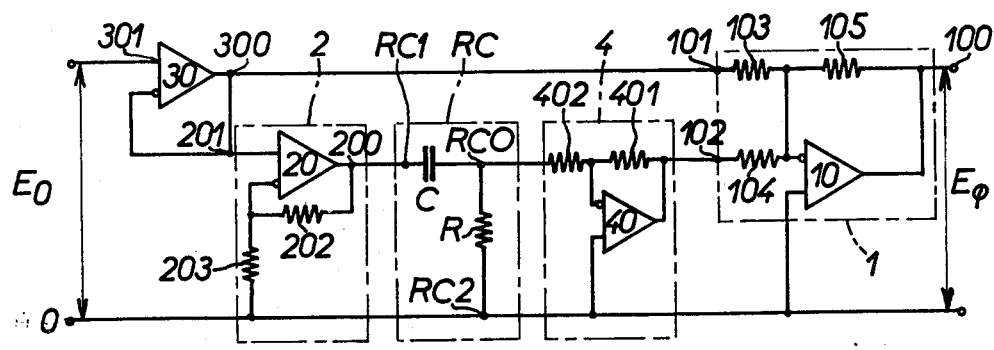
FIG. 1 is a wiring diagram of a phase converter concerned by the present invention.

$V_3$ correspond to the voltage delivered at the terminal RCO (FIG. 1) common to capacitor C and resistor R of the impedance circuit RC, when the non-common terminal RC2 of resistor R is connected to the common point O of the reference voltage Eo and phase-displaced voltage E$\phi$, and the non-common terminal RC1 of capacitor C is connected to the reference voltage Eo.

The sum of the two voltages $V_1$ and $V_2$ is obtained by means of a summation device 1 having a first input 101 and a second input 102. This summation device 1 comprises a first inverter amplifier 10 connected in a manner known per se as an adder to parallel-connected resistors 103, 104, with a feedback reaction resistor 105.

The operation consisting in doubling the third voltage $V_3$ for obtaining said voltage $V_2$ is obtained through a second amplifier 20 constituting with resistors 202 and 203 having the same values a two-gain amplifier adapted to operate as a multiplier by 2 of the amplitude. The combination of a divider by 5 of the amplitude with a multiplier by 10 of the amplitude constitutes a multiplier by two of the amplitude suitable for the purposes of the present invention. Such combination further permits of operating the resistor R at a lower level if the divider by 5 is disposed before the impedances circuit and the multiplier by 10 after this circuit.

The output 200 of this amplifier is connected to the non-common terminal RC1 of capacitor C, and the input 201 of amplifier 20 is connected on the one hand to the first input 101 of the summation device 1 and on the other hand to one output 300 of a third amplifier 30 connected as a separator and having its other input 301 connected to the reference voltage Eo.

The opposition of signs between the first and second added voltages denoted $V_1$ and $V_2$ respectively, is obtained by means of a fourth amplifier 40 connected in a manner known per se with resistors 401 and 402 having equal values, in order to constitute a unit-gain inverted 4.

This inverter 4 is switched in between the second input 102 of the summation device 1 and the terminal RCO common to capacitor C and resistor R.

The subservience of permanent regulation of the phase in the phase converter is obtained by controlling the value of the phase displacement angle at the desired value $\phi$ by regulating the value of impedance RC of circuit RC by means of a so-called error voltage U$\Delta$ depending on the desired value of angle $\phi$ and also on the actual displacement angle between the reference voltage E$\phi$ and the actually delivered voltage E$\phi_e$. (E$\phi_e$ = E$\phi$ when the actual phase displacement angle $\phi_e$ assumes the desired $\phi$ value). This voltage U$\Delta$ varies when the discrepancy between the actual angle $\phi_e$ of the phase displacement and the desired value $\phi$ of this angle increases, and controls therefore the value of impedance RC in order to reduce the difference between $\phi_e$ and $\phi$.

More particularly, the error voltage U$\Delta$ is an algebraic sum of a reference voltage U external to the phase converter, which is displayed by the user and depends only on the desired value of $\phi$, and of an information voltage $\Delta$ depending on the value $\phi_e$ of the actual phase displacement angle, this information voltage $\Delta$ consisting of the difference between the modules:

$$\Delta = |Eo + E\phi_e| - |Eo - E\phi_e| - 2\sqrt{2}|Eo|$$
$$\text{Sin}[\pi/4 - (\phi_e/2)].$$

Figure 2:
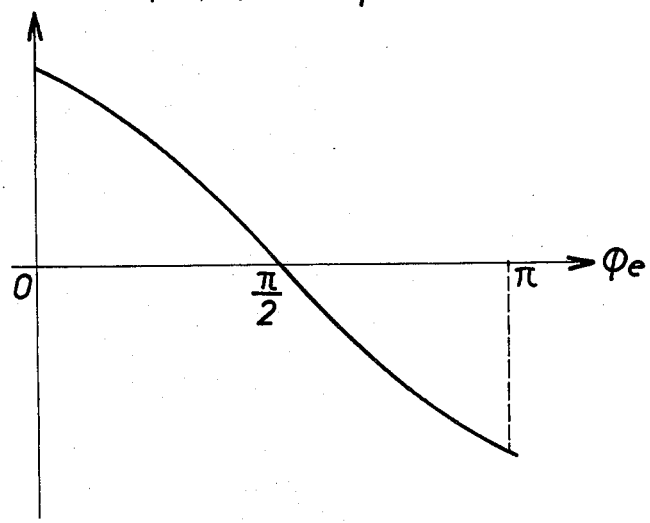
FIG. 2 is a diagram showing the electrical magnitude $\Delta$ controlling according to this invention the subservience of a phase converter as a function of the desired phase displacement angle.

FIG. 2 illustrates the diagram designating the various values of the information voltage $\Delta$ as a function of the values of angle $\phi_e$.

If the control voltage U is zero, the subservience of the phase angle $\phi$ to the value $\pi/2$ is obtained when $\Delta$ = 0. About the value $\phi_e = \pi/2$ the voltage $\Delta\phi_e$ is a substantially linear function and a precision of $10^{-5}$ radian for the phase angle $\phi$ may be obtained in this area.

The impedance RC at a given frequency $\omega/2\pi$ may be controlled by resorting to any known technical means by modifying the values R of the resistor or C of the capacitor. Thus, for example, the resistor R may consist at least in part of the conduction resistance of a field effect transistor FET (FIG. 3) receiving at its grid G an error voltage U depending notably on the desired phase displacement angle for the frequency $\omega/2\pi$ contemplated.

The synthesis of the information voltage $\Delta$ is accomplished by obtaining E1 = $|Eo + E\phi_e|$ and E2 = $|Eo - E\phi_e|$, by rectifying the sine curves $E_1(\phi_e)$ and $E_2(\phi_e)$, and utilizing the average values of these voltages $E_1$ and $E_2$, that is, quantities proportional to their modulus.

For this purpose, the first summation and rectifying device 6 illustrated in FIG. 3 receives at a first input 601 the reference voltage Eo and at a second input 602 the phase displaced voltage E$\phi$ (to simplify the notations, it is assumed that the subservience of the phase converter is already achieved, so that the actually delivered voltage E$\phi_e$ is in fact the desired phase displaced voltage E$\phi$).

A second summation and rectifying device 7 receives at a first input 701 the reference voltage Eo and at a second input 702 the phase displaced voltage E$\phi$.

A second inverter 5 is switched in at one of the inputs 701, 702 of this second summation and rectifying device 7.

The outputs 600, 700 of the two summation and rectifying devices 6, 7 are each connected to one input 901, 902 respectively of a summation and filtration device 9 having another input 903 to which the reference voltage U is fed. The summation and filtration device 9 is adapted notably to act as a low-pass filter in order to reduce the instantaneous modulation of the output signal phase.

A third inverter 8 is switched in at the output (for instance output 700) of one of the summation and rectifying devices 6, 7. The output 900 of the summation and filtration device 9 is connected to a control terminal K of the impedance circuit RC.

The polarities and relative arrangements of inverters 5, 8 of the aforesaid summation devices 6, 7 and also of the summation and filtration device 9 are so selected that the phase displacement angle $\phi_e$ is responsive to the value $\phi$ whereat the information voltage $\Delta$ is equal to the reference voltage U.

When the regulation of the circuit impedance RC is obtained by changing the conduction resistance of a field effect transistor FET, the output 900 of the summation and filtration device 9 is connected to the grid G of this transistor FET.

According to a specific embodiment of the regulating means of this phase converter, illustrated in FIG. 4, the second inverter circuit 5 comprises a fifth amplifier 50 connected in a manner known per se as a unity-gain separator through resistors 501 and 502. A first summation and rectifying device 6 comprises a sixth amplifier 60 connected to said summation device by means of resistors 603 and 604, the feedback of this amplifier 60 being obtained by means of two parallel-connected circuits comprising each, in addition to a resistor 605, 606 a diode 607, 608 in order to deliver separately the positive half-waves and the negative half-waves of the sum of the reference voltage Eo and of the phase displaced reference E$\phi$.

The second summation and rectifying device 7 comprises a seventh amplifier 70 connected like the preceding one by means of homologue resistors and diodes 703, 704, 705, 706, 707 and 708, so as to deliver separately the positive half-waves and the negative half-waves of the sum of the negative reference voltage, of the sum of E$\phi$reference voltage Eo and of the phase displaced voltage E$\phi$.

The third inverter 8 comprises an eighth amplifier 80 connected as an adder by means of resistors 803, 804 and of a feedback resistor 805. This third inverter 8 receives at a first input 801 the negative half-waves of the sixth amplifier 6 and at a second input 802 the positive half-waves of the seventh amplifier 7.

The summation and filtration device 9 comprises a ninth amplifier 90 connected as an integrator to the parallel-connected resistors 905, 906, 907 and 908, by utilizing a feedback capacitor 904. This summation and filtration device receives at a first input 901 the positive half-waves of the sixth amplifier 60 and at a second input 902A the negative half-waves of the seventh amplifier 70, at a third input 902B the output of the eighth amplifier 80 and at a fourth input 903 the reference voltage U.

The subservience thus obtained by means of the above-described device affords a constant phase regulation even in case of variation in the frequency of the alternating reference voltage Eo.

Of course, the above-described form of embodiment should not be construed as limiting the scope of the present invention since various modifications and changes may be brought thereto without departing from the basic principles of the invention as recited in the following claims.

What is claimed as new is:

1. Phase converter for dephasing a sinusoid reference voltage Eo and producing a sinusoid regulated phase displaced voltage E$\phi$ of same frequency and same magnitude, and having a common point with said sinusoid reference voltage, this phase converter comprising:
   an input terminal served with said sinusoid reference voltage,
   an output terminal meant for delivering said regulated phase displaced voltage,
   a summation circuit having a first input, a second input and an output, said first input of said summation circuit being connected to said input terminal through a first circuit path, said second input of said summation circuit being connected to said input terminal through a second circuit path, and said output of said summation circuit being connected to said output terminal,
   a two gain amplifier mounted in series in said second circuit path,
   an impedance circuit mounted in series in said second circuit path, said impedance circuit comprising a variable impedance element having a grounded terminal and a control terminal,
   an inverter mounted in series in one of said first and second circuit paths, and
   a phase-control circuit comprising a first input, a second input, and a control output, said first input of said phase control circuit being connected to said input terminal served with said sinusoid reference voltage, said second input of said phase control circuit being connected to said output terminal meant for delivering said regulated phase displaced voltage, and said control output being connected to said control terminal of said impedance element, said phase control circuit further comprising means for serving said control output with an error signal having a magnitude equal, to an additional constant, to a difference $|Eo + E| - |Eo - E|$ between the magnitude $|Eo + E|$ of a sum of said sinusoid reference voltage and said regulated phase displaced voltage and the magnitude $|Eo - E|$ of a difference between said sinusoid reference voltage and said regulated phase displaced voltage.

2. Phase converter according to claim 1, wherein said variable impedance element is a field effect transistor, and wherein said serving means comprises:
   a first summation and rectifying unit having a first input connected to said first input of said phase-control circuit, a second input connected to said second input of said phase control circuit, and an output,
   a second summation and rectifying unit having a first input connected to said first input of said phase control circuit, a second input connected to said second input of said phase control circuit, and an output,
   a second inverter switched in at one of said inputs of said second summation and rectifying unit,
   a summation and filtration unit having a first input connected to the output of said first summation and rectifying unit, a second input connected to the output of said second summation and rectifying unit, a third input receiving a control voltage U, and an output constituting said control output, and,
   a third inverter switched in at the output of one of said summation and rectifying units.

3. Phase converter according to claim 1, wherein said variable impedance element is a field effect transistor, and wherein said serving means comprises:
   a first summation and rectifying unit having a first input connected to said first input of said phase control circuit, a second input connected to said second input of said phase control circuit, and first and second outputs, said first summation and rectifying unit comprising a sixth amplifier connected as a summation device, said sixth amplifier having a feedback network comprising two parallel-connected circuits including each a diode so as to deliver separately on said first and second outputs, respectively, positive half-waves and negative half-waves of a sum of said sinusoid reference voltage and said regulated phase displaced voltage,
   a second summation and rectifying unit having a first input connected to said first input of said phase control circuit, a second input connected to said second input of said phase control circuit, and first and second outputs, said second summation and rectifying unit comprising seventh amplifier connected as a summation device, said seventh amplifier having a feedback network comprising two parallel-connected circuits including each a diode so as to deliver separately on said first and second outputs, respectively, negative half waves and positive half-waves of a difference between said sinusoid reference voltage and said regulated phase displaced voltage, a second inverter switched in at one of said inputs of said second summation and rectifying unit, a third inverter comprising an eighth amplifier connected as an adder and having a first input connected to the second output of said first summation and rectifying unit, a second input connected to the second output of said second summation and rectifying unit, and an output, and, a summation and filtration unit comprising a ninth amplifier connected as an integrator, said summation and filtration unit having a first input connected to the first output of said first summation and rectifying unit, a second input connected to the first output of said second summation and rectifying unit, a third input connected to the output of said third inverter, a fourth input receiving a control voltage U, and an output constituting said control output.

* * * * *